(12) United States Patent
Xia et al.

(10) Patent No.: US 7,990,718 B2
(45) Date of Patent: Aug. 2, 2011

(54) HEAT DISSIPATION DEVICE HAVING A CLIP ASSEMBLY

(75) Inventors: Hui Xia, Shenzhen (CN); Min Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 123 days.

(21) Appl. No.: 12/535,675

(22) Filed: Aug. 4, 2009

(65) Prior Publication Data

US 2010/0259902 A1    Oct. 14, 2010

(30) Foreign Application Priority Data

Apr. 10, 2009   (CN) .......................... 2009 1 0301484

(51) Int. Cl.
*H05K 7/20* (2006.01)
(52) U.S. Cl. ....... 361/710; 361/704; 257/718; 165/80.3; 174/16.3
(58) Field of Classification Search .................. None
See application file for complete search history.

(56) References Cited

U.S. PATENT DOCUMENTS

| 6,510,054 | B1 * | 1/2003 | Chen ............................ 361/704 |
| 6,947,283 | B2 | 9/2005 | Hsieh et al. |
| 7,518,874 | B2 * | 4/2009 | Deng et al. .................... 361/710 |
| 7,746,645 | B2 * | 6/2010 | He et al. ........................ 361/709 |
| 2003/0103332 | A1 * | 6/2003 | Sopko et al. .................. 361/704 |
| 2009/0151896 | A1 * | 6/2009 | Chen et al. ................... 165/80.3 |

* cited by examiner

*Primary Examiner* — Jayprakash N Gandhi
*Assistant Examiner* — Courtney Smith
(74) *Attorney, Agent, or Firm* — Frank R. Niranjan

(57) ABSTRACT

A heat dissipation device for removing heat from an electronic component mounted on a printed circuit board includes a heat sink, a wire clip and two operating members. The heat sink has a bottom for in contact with the electronic component. The wire clip includes a middle part spanning over the heat sink and two latching legs extending oppositely from two opposite ends of the middle part, respectively, the two latching legs being located in front of and in rear of the heat sink, respectively. Each operating member includes a plate cam placed on the heat sink and a handle extending laterally from the plate cam. The middle part of the wire clip extends through the plate cams and can be lifted away from the heat sink by turning the operating members from an unlocking state to a locking state.

20 Claims, 6 Drawing Sheets

HEAT DISSIPATION DEVICE HAVING A CLIP ASSEMBLY

BACKGROUND

1. Technical Field

The present disclosure relates to a heat dissipation device, and more particularly to a heat dissipation device having a clip assembly which can readily and securely attach a heat sink to an electronic component.

2. Description of Related Art

A heat sink is usually placed in thermal contact with an electronic package such as a central processing unit (CPU), and transfers heat through conduction away from the electronic package so as to prevent over-heating of the electronic package. Usually, the heat sink is secured to the electronic package by a clip.

Conventionally, a heat dissipation device including a heat sink and a wire clip securing the heat sink to an electronic component mounted on a printed circuit board. The heat sink comprises a base and a plurality of fins extending from the base. A plurality of grooves is defined between adjacent fins. Two neighboring fins in the middle of the heat sink project a pair of bulges facing to each other. The clip spans across the groove in the middle of the heat sink with a positioning portion received in the middle of the heat sink in a manner such that the positioning portion abuts against the bulges and the base of the heat sink. Two arms, which extend from two ends of the positioning portion, have a pair of hooks engaging with the printed circuit board, thereby securing the heat sink to the printed circuit board.

To secure the heat sink onto the electronic component mounted on the printed circuit board, the two arms are pressed downwardly to fasten to the printed circuit board. However, the clip is formed by bending an elastic wire which is too skiddy to be operated. The heat sink is secured on the electronic component by a downward tensile force of the clip from its elastic deformation and exerting on a top of the heat sink. The arms need a powerful pressure to make the clip deform in one step. Therefore, the arms are hard to be pressed downwardly to reach the printed circuit board and easy to slide away to rebound to hurt the operator and thus make an attachment of the heat sink uneasy.

What is needed, therefore, is a heat dissipation device having an improved clip assembly which can overcome the above problem.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
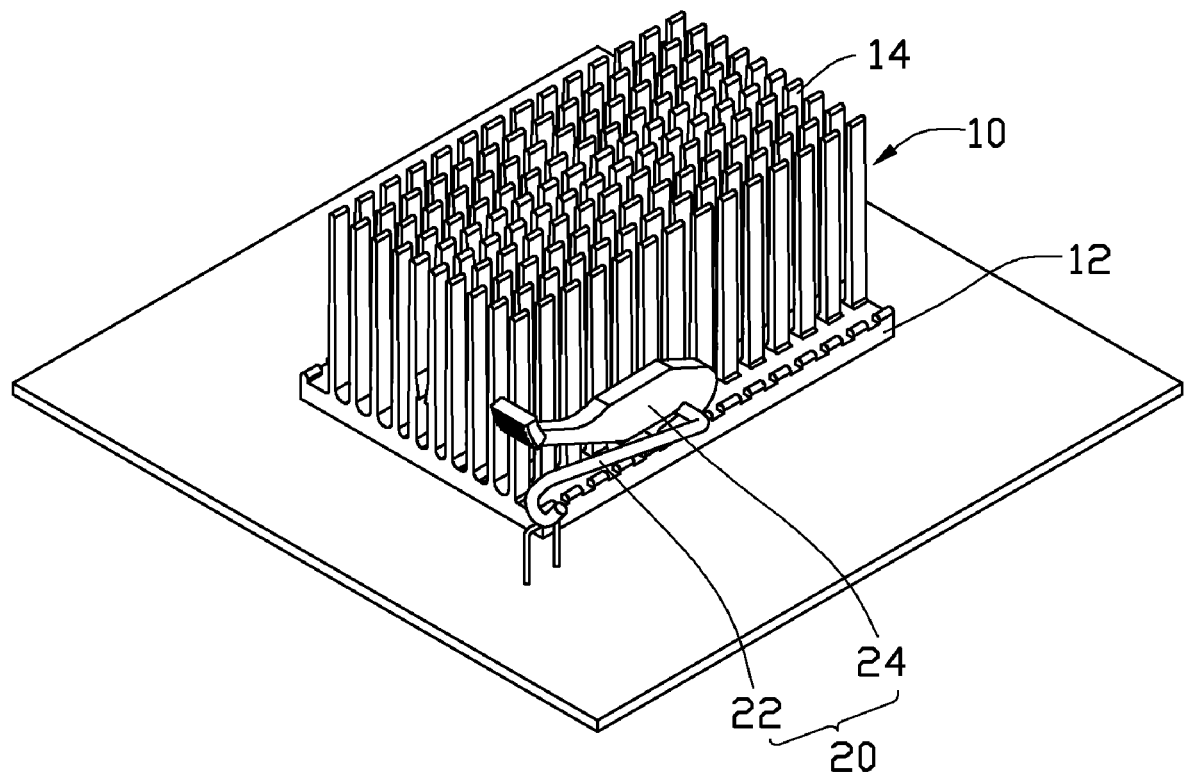
FIG. 1 is an isometric, assembled view of a heat dissipation device in accordance with an embodiment of the present disclosure, mounted on a printed circuit board.
Figure 2:
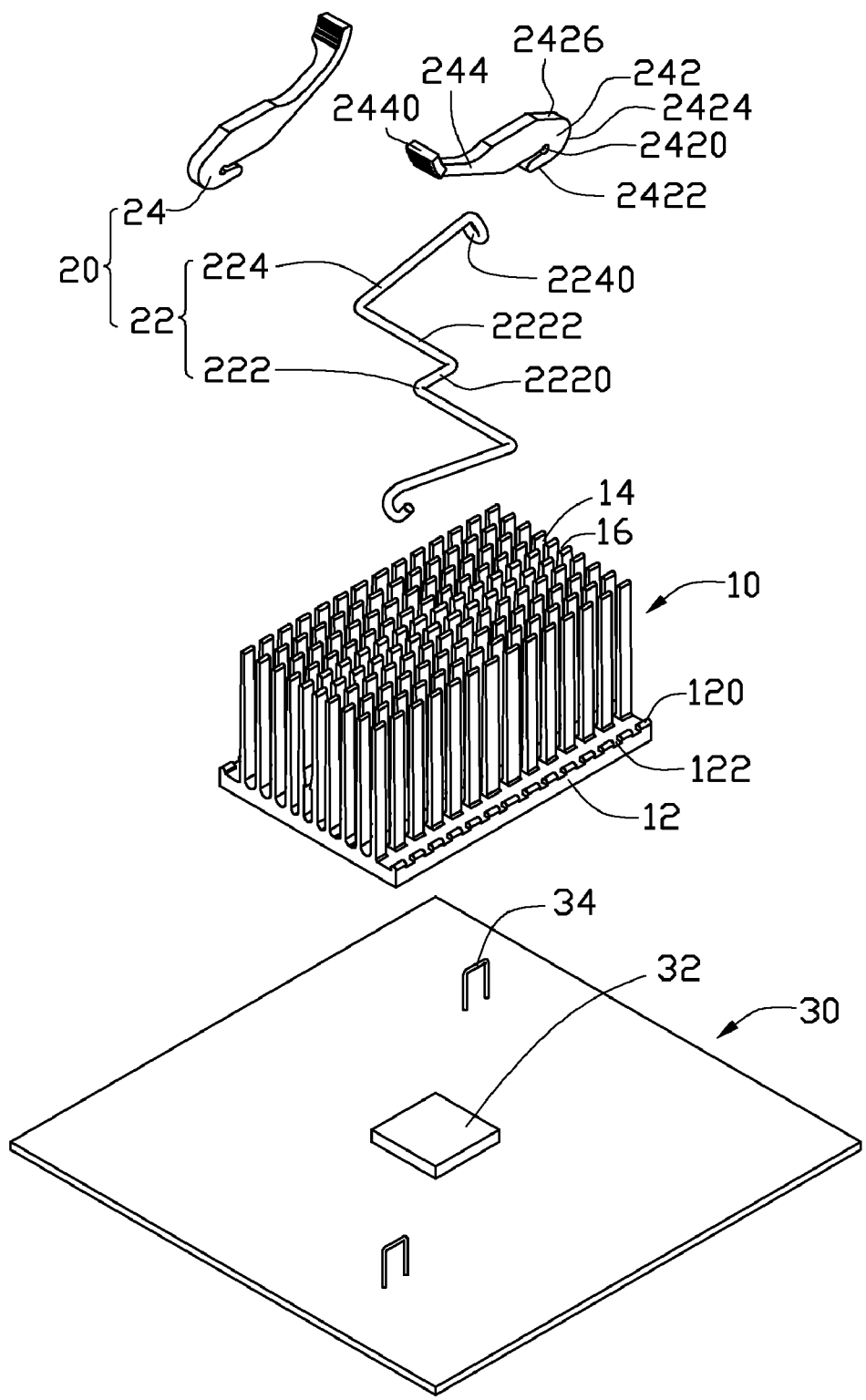
FIG. 2 is an exploded view of the heat dissipation device and the printed circuit board of FIG. 1.

Referring to FIGS. 1-2, a heat dissipation device in accordance with an embodiment of the disclosure is shown. The heat dissipation device includes a heat sink 10 having a bottom for contacting with an electronic component 32 mounted on a printed circuit board 30 and a clip assembly 20 spanning on the heat sink 10 to secure the heat sink 10 onto the printed circuit board 30 so that the heat sink 10 can have an intimate contact with the electronic component 32.

Figure 3:
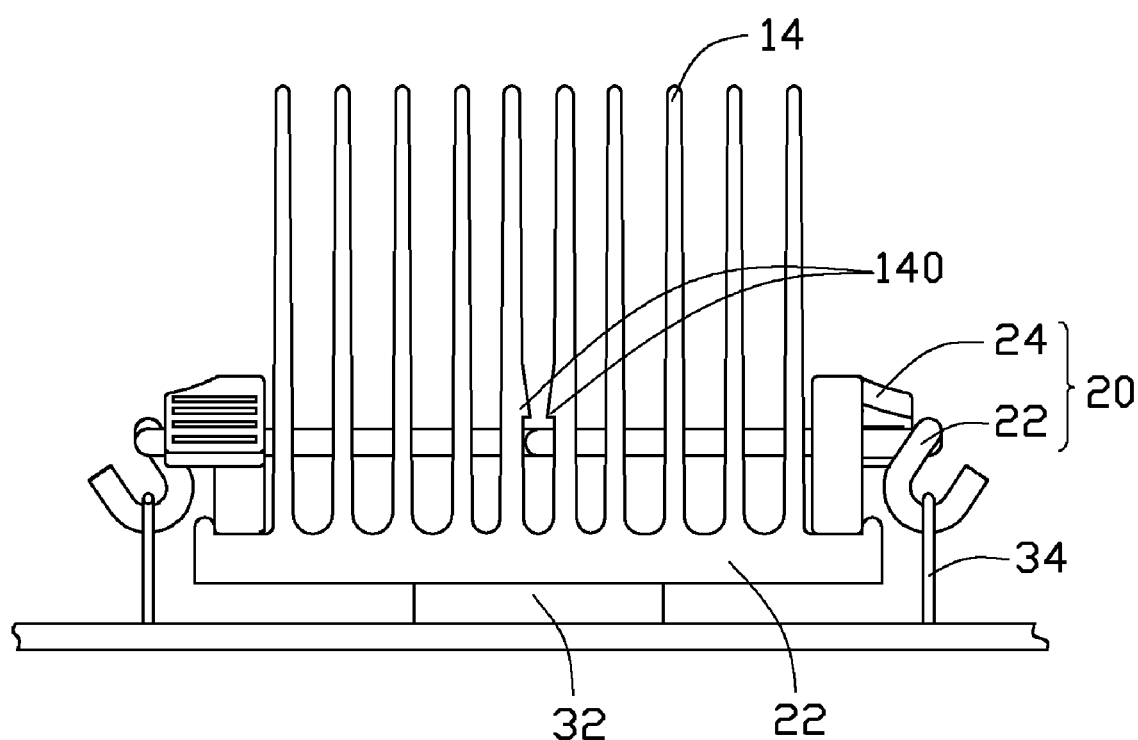
FIG. 3 is a side view of the heat dissipation device of FIG. 1 assembled to the printed circuit board.

The heat sink 10 comprises a rectangular base plate 12 having a bottom face for thermally contacting with the electronic component 32, and a plurality of fins 14 integrally extending upwardly and perpendicularly from a top face of the base plate 12. The fins 14 are parallel to front and rear sides of the heat sink 10 and spaced from each other with a predetermined distance. A plurality of lengthways channels 16 each is defined between every two neighboring fins 14 and parallel to the front and rear sides of the heat sink 10. A plurality of transverse channels 18 are defined in the heat sink 10, perpendicular to the lengthways channels 16 and extend through the fins 14 and divide the fins 14 into plural equal parts. Referring to FIG. 3, two restricting protrusions 140 protrude toward each other from two respective facing sides of two neighboring middle ones of the fins 14. Each restricting protrusion 140 is located over and separated from the base plate 12 and defines an inclined surface on an upper, inner side thereof. The inclined surface faces upwardly for facilitating the clip assembly 20 to move downwardly therethrough. Two protruding strips 120 protrude upwardly from the front and rear side edges of the base plate 12, respectively, and are separated from fins 14.

The clip assembly 20 comprises a wire clip 22 and two operating members 24 mounted on the wire clip 22 to operating the wire clip 22. The wire clip 22 is made from a single spring wire and comprises a middle part 222 spanning over the base 12 and two latching legs 224 extending perpendicularly and oppositely from two opposite ends of the middle part 222. The middle part 222 comprises a restricting portion 2220 and two pressing portions 2222 extending oppositely and perpendicularly from two opposite ends of the restricting portion 2220. Also referring to FIG. 3, the restricting portion 2220 is received in a central part of the lengthways channel 16 between the two middle fins 14 and located between the two restricting protrusions 140 of the two middle fins 14 and the base plate 12. The restricting portion 2220 is restricted to be movable between the restricting protrusions 140 and the base plate 12 during operation and use of the clip assembly 20. Most parts of two pressing portions 2222 adjacent to the restricting portion 2220 are respectively received in two separated transverse channels 18 located at two sides of the central part of the middle one of the lengthways channels 16 where the restricting portion 2220 being received. Other parts of two pressing portions 2222 adjacent to the two latching legs 224 are located outside of the fins 14 and respectively located in rear of and in front of the fins 14.

The two latching legs 224 are parallel to each other and extend oppositely from two respective free ends of the pressing portions 2222 of the middle part 222. Each distal end of the latching legs 224 is provided with a hook 2240 facing outwardly to fasten to two corresponding anchors 34 mounted on the printed circuit board 30. The hook 2240 is formed by bending the distal end of the latching leg 224 downwardly and then upwardly so that the hook 2240 has a U-shaped configuration.

The two operating members 24, each integrally formed by plastic injection molding, are respectively engaged with the pressing portions 2222 of the wire clip 22. The operating members 24 are placed on the base plate 12 and respectively located between the fins 14 and the two protruding strips 120 of the base plate 12. Each operating member 24 comprises a plate cam 242 and a handle 244 extending laterally from the plate cam 242. The plate cam 242 therein defines an elongated recession 2420 from a circumference toward a center thereof for receiving the pressing portion 2222 of the wire clip 22 therein. The elongated recession 2420 terminates deep in the plate cam 242 with an opening circular hole (not labeled) which has a caliber larger than other part of the elongated recession 2420 for engagingly receiving the pressing portion 2222 therein. The plate cam 242 defines a releasing face 2422 on a lower part of the circumference thereof and located under the elongated recession 2420, a locking face 2426 on an upper part of the circumference thereof and located above the elongated recession 2420 and an arched connecting face 2424 on a lateral part of the circumference thereof and located between and connecting the releasing and locking faces 2422, 2426. A distance from the circular hole of the elongated recession 2420 to the locking face 2426 is larger than that from the circular hole of the elongated recession 2420 to the releasing face 2422. A holding part 2440 is defined at a distal end of the handle 244 and is curved upwardly. The holding part 2440 defines a plurality of spaced skidproof protrusions on two opposite sides thereof for facilitating an operation of the operating member 24.

Figure 4:
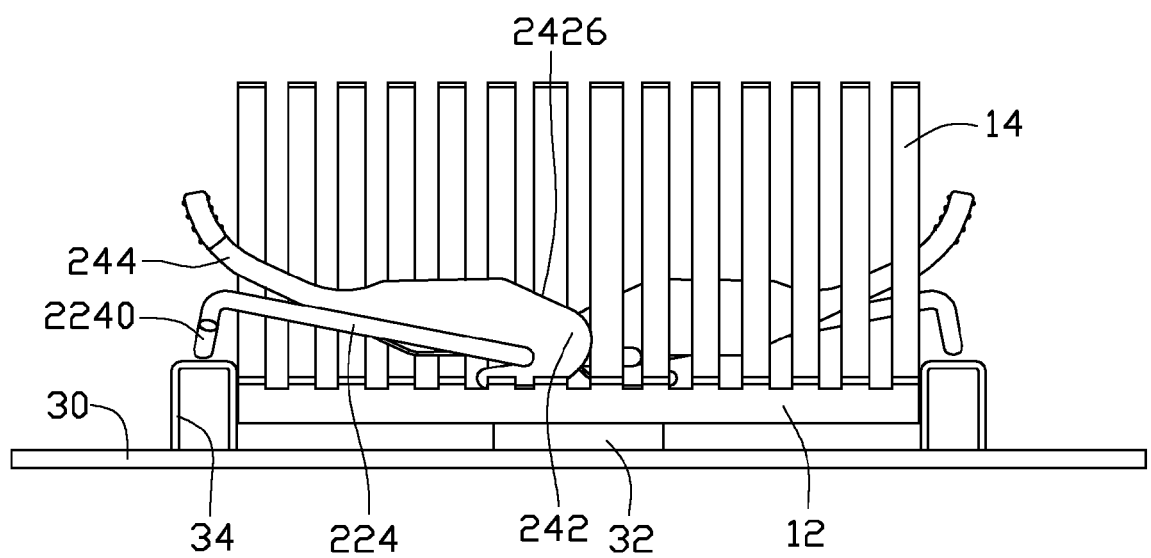
FIG. 4 is a front, elevational view of the heat dissipation device of FIG. 1 resting on the printed circuit board.
Figure 5:
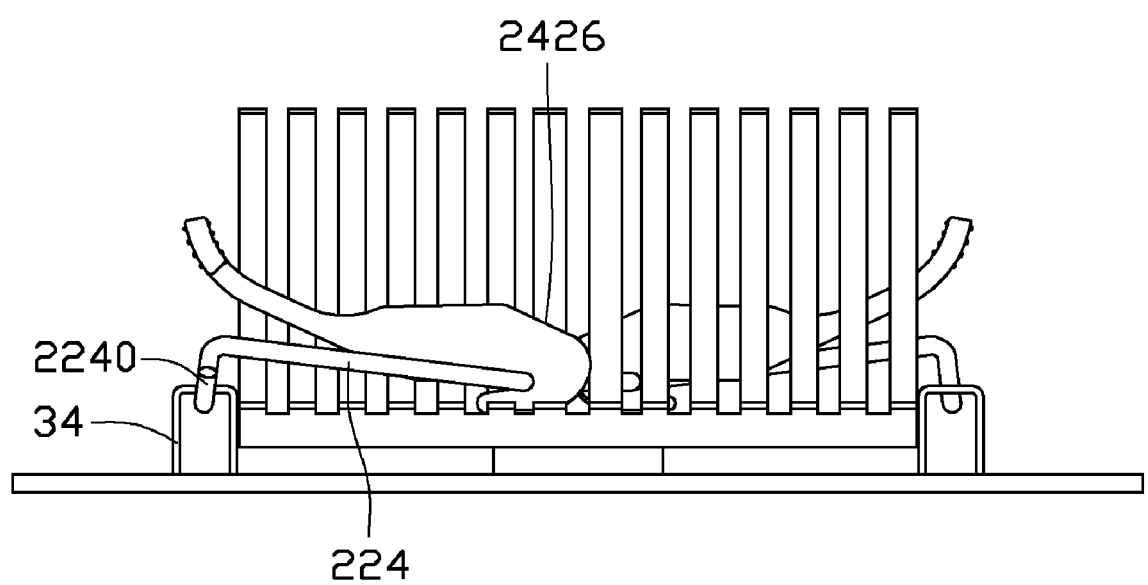
FIG. 5 is a front, elevational view of the heat dissipation device of FIG. 4 with a clip assembly thereof in an unlocking state.
Figure 6:
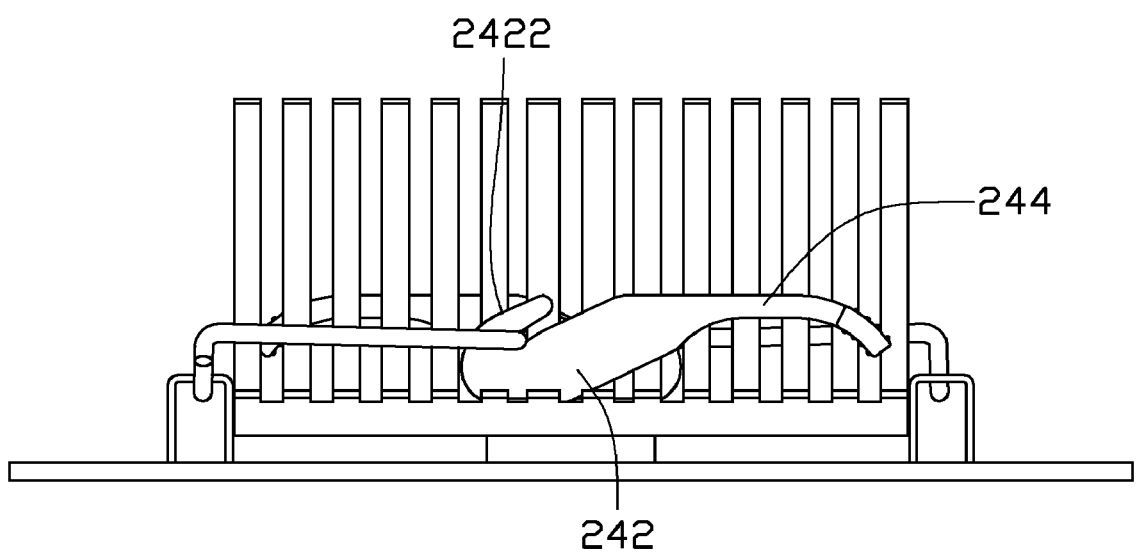
FIG. 6 is a front, elevational view of the heat dissipation device of FIG. 4 with the clip assembly thereof in a locking state.

As shown in FIGS. 4-6, to secure the heat sink 10 on the printed circuit board 30, the middle part 222 of the wire clip 22 is placed in the corresponding channels 16 and 18 of the heat sink 10, and the two opposite latching legs 224 parallel to the fins 14 are respectively located in front of and in rear of the fins 14. The two operating members 24 are located on the base plate 12 and respectively located between the fins 14 and the two protruding strips 120 of the base plate 12. Two portions of the two pressing portions 2222 of the wire clip 22 outside of the corresponding transverse channels 18 of the heat sink 10 are engagingly received in the elongated recessions 2420 of the operating members 24. Firstly, the releasing faces 2422 of the plate cams 242 of the operating members 24 are rested on the base plate 12 to place the clip assembly 20 in an unlocking state, so that the latching legs 224 of the wire clip 22 are easily pressed downwardly toward the printed circuit board 30 to make the hooks 2240 to reach and catch the corresponding anchors 34 of the printed circuit board 30.

Secondly, the handles 244 of the operating members 24 are then rotated from one lateral side of the heat sink 10 toward another opposite lateral side to roll the plate cams 242 on the base plate 12, during which the releasing faces 2422 of the plate cams 242 are rolled away from the base plate 12 and the locking faces 2426 of the plate cams 242 are turned to engage the base plate 12. The clip assembly 20 is thus turned from the unlocking state to a locking state. Since the distance from the circular hole of the elongated recession 2420 to the locking face 2426 is larger than that from the circular hole of the elongated recession 2420 to the releasing face 2422, when the clip assembly 20 is turned from the unlocking state to the locking state, the pressing portions 2222 of the wire clip 22 are lifted to move away from the base plate 12 to make wire clip 20 be further deformed, whereby the wire clip 20 further presses the plate cam 242 downwardly to urge the heat sink 10 toward the printed circuit board 30.

According to above description, the heat sink 10 is secured onto the electronic component 32 by the clip assembly 20 in two steps. In the first step, the wire clip 22 is slightly deformed to move the latching legs 224 and accordingly the hooks 2240 to engage with the anchors 34 with a small elastic force; therefore attachments of the hooks 2240 of the latching legs 224 of the wire clip 22 to the anchors 34 can be easily completed.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device for removing heat from an electronic component mounted on a printed circuit board, the heat dissipation device comprising:
    a heat sink having a bottom for making contact with the electronic component; and
    a wire clip comprising a middle part spanning over the heat sink and two latching legs extending oppositely from two opposite ends of the middle part, respectively, the two latching legs being located in front of and in rear of the heat sink, respectively; and
    two operating members each comprising a plate cam placed on the heat sink and a handle extending laterally from the plate cam;
    wherein the middle part of the wire clip extends in the plate cam so the plate cam is pivotably connected to the middle part of the wire clip, and can be lifted away from the heat sink by turning the operating members from an unlocking state to a locking state; and
    wherein each plate cam defines a releasing face and a locking face both on a circumference thereof, the releasing face being rested on the heat sink in the unlocking state, and the locking face being rested on the heat sink in the locking state.

2. The heat dissipation device as claimed in claim 1, wherein a distance from the middle part of the wire clip to the locking face is further than a distance from the middle part to the releasing face.

3. The heat dissipation device as claimed in claim 2, wherein the plate cam therein defines an elongated recess from a circumference toward a center, the elongated recess being terminated deep in the plate cam with an opening circular hole engagingly receiving the middle part of the wire clip therein.

4. The heat dissipation device as claimed in claim 1, wherein the latching legs each form a hook at a distal end thereof and are rotated downwardly relative to the middle part to force the hook to catch the printed circuit board.

5. The heat dissipation device as claimed in claim 1, wherein the heat sink comprises a base plate and a plurality of fins extending upwardly from a top surface of the base plate, the two cams being placed on the base plate and located in front and in rear of the fins, respectively.

6. The heat dissipation device as claimed in claim 5, wherein two protruding strips extend upwardly from front and rear side edges of the base plate, the two plate cams being placed between the fins and the two protruding strips, respectively.

7. The heat dissipation device as claimed in claim 5, wherein the middle part of the wire clip comprises a restricting portion and two pressing portions extending oppositely and perpendicularly from two opposite ends of the restricting portion, the pressing portions extending through the plate cams.

8. The heat dissipation device as claimed in claim 7, wherein a plurality of lengthways channels are defined between the fins, while a plurality of transverse channels perpendicular to the lengthways channels are defined in the fins and cut the fins into plural parts, the restricting portion being received in a middle one of the lengthways channels formed between two neighboring middle ones of the fins, and most parts of the two pressing portions being received in two separated transverse channels at two sides of the restricting portion.

9. The heat dissipation device as claimed in claim 8, wherein two restricting protrusions protrude toward each other from two respective facing sides of the two neighboring middle ones of the fins, the restricting portions of the wire clip being restricted to be movable between the restricting protrusions and the base plate.

10. The heat dissipation device as claimed in claim 9, wherein each restricting protrusion defines an inclined surface on upper and inner faces thereof and facing upwardly for facilitating the restricting portion of the wire clip to pass downwardly therethrough.

11. A heat dissipation device for removing heat from an electronic component mounted on a printed circuit board, the heat dissipation device comprising:
  a heat sink comprising a base plate having a bottom for making contact with the electronic component and a plurality of fins extending upwardly from a top surface of the base plate;
  a wire clip comprising a middle part located between the fins and spanning over the base plate and two latching legs extending oppositely from two opposite ends of the middle part, respectively, the two latching legs being located in front of and in rear of the fins, respectively; and
  two operating members each comprising a plate cam placed on the base plate and a handle extending laterally from the plate cam, the two plate cams being located in the front of and in the rear of the fins, respectively;
  wherein the middle part of the wire clip extends through the plate cams outside of the fins and can be lifted away from the base plate by turning the operating members from an unlocking state to a locking state; and
  wherein each plate cam defines a releasing face and a locking face both on a circumference thereof, the releasing face being rested on the base plate in the unlocking state, and the locking face being rested on the base plate in the locking state.

12. The heat dissipation device as claimed in claim 11, wherein a distance from the middle part of the wire clip to the base plate is further than a distance from the middle part to the base plate.

13. The heat dissipation device as claimed in claim 12, wherein the plate cam therein defines an elongated recess from a circumference toward a center, the elongated recess being terminated deep in the plate cam with an opening circular hole engagingly receiving the middle part of the wire clip therein.

14. The heat dissipation device as claimed in claim 11, wherein the latching legs each form a hook at a distal end thereof and are rotated downwardly relative to the middle part to force the hook to engage with the printed circuit board.

15. The heat dissipation device as claimed in claim 14, wherein the middle part of the wire clip comprises a restricting portion and two pressing portions extending oppositely and perpendicularly from two opposite ends of the restricting portion, the pressing portions extending through the plate cams.

16. The heat dissipation device as claimed in claim 15, wherein a plurality of lengthways channels are defined between the fins, while a plurality of transverse channels perpendicular to the lengthways channels are defined in the fins and cut the fins into plural parts, the restricting portion being received in a middle one of the lengthways channels formed between two neighboring middle ones of the fins, and most parts of the two pressing portions being received in two separated transverse channels at two sides of the restricting portion.

17. The heat dissipation device as claimed in claim 16, wherein two restricting protrusions protrude toward each other from two respective facing sides of the two neighboring middle ones of the fins, the restricting portions of the wire clip being restricted to be movable between the restricting protrusions and the base plate.

18. The heat dissipation device as claimed in claim 17, wherein each restricting protrusion defines an inclined surface on upper and inner faces thereof and facing upwardly for facilitating the restricting portion of the wire clip to pass downwardly therethrough.

19. A heat dissipation device for removing heat from an electronic component mounted on a printed circuit board, the heat dissipation device comprising:
  a heat sink comprising a base plate having a bottom for making contact with the electronic component and a plurality of fins extending upwardly from a top surface of the base plate;
  a wire clip comprising a middle part spanning over the heat sink and two latching legs extending oppositely from two opposite ends of the middle part, respectively, the two latching legs being located in front of and in rear of the heat sink, respectively; and
  two operating members each comprising a plate cam placed on the heat sink and a handle extending laterally from the plate cam;
  wherein the middle part of the wire clip extends in the plate cam so the plate cam is pivotably connected to the middle part of the wire clip, and can be lifted away from the heat sink by turning the operating members from an unlocking state to a locking state;
  wherein the two cams are placed on the base plate and located in front and in rear of the fins, respectively; and
  wherein two protruding strips extend upwardly from front and rear side edges of the base plate, the two plate cams being placed between the fins and the two protruding strips, respectively.

20. The heat dissipation device as claimed in claim 19, wherein each plate cam defines a releasing face and a locking face both on a circumference thereof, the releasing face being rested on the heat sink in the unlocking state, the locking face being rested on the heat sink in the locking state.

* * * * *